United States Patent [19]

Noguchi

[11] Patent Number: 4,681,394

[45] Date of Patent: Jul. 21, 1987

[54] LIGHT BEAM SCANNING SYSTEM

[75] Inventor: Masaru Noguchi, Kanagawa, Japan

[73] Assignee: Fuji Photo Film Co., Ltd., Kanagawa, Japan

[21] Appl. No.: 833,621

[22] Filed: Feb. 27, 1986

[30] Foreign Application Priority Data

Mar. 1, 1985 [JP] Japan .................................. 60-40685

[51] Int. Cl.$^4$ ............................................. G02B 26/10
[52] U.S. Cl. ...................................... 350/6.6; 350/6.7
[58] Field of Search ................... 350/6.6, 6.7, 6.8, 6.5, 350/6.91

[56] References Cited

U.S. PATENT DOCUMENTS 4,509,819 4/1985 Sherman et al. ..................... 350/6.7

Primary Examiner—John K. Corbin
Assistant Examiner—Loha Ben
Attorney, Agent, or Firm—Sughrue, Mion, Zinn, Macpeak, and Seas

[57] ABSTRACT

In a light beam scanning system, a plurality of laser beams emitted by a plurality of semiconductors are combined into a single laser beam, and the single laser beam is deflected to sweep a surface-to-be-scanned. The oscillation wavelengths of the semiconductor lasers are selected so that the oscillation wavelengths $\lambda i$ and $\lambda j$ of any two of the semiconductor lasers satisfy the formula $$|\lambda i - \lambda j| \geq \lambda i \lambda j M / c$$

wherein M and c respectively represent the picture element frequency and the velocity of light.

2 Claims, 4 Drawing Figures

LIGHT BEAM SCANNING SYSTEM

BACKGROUND OF THE INVENTION

1. Field of the Invention

This invention relates to a light beam scanning system, and more particularly to a light beam scanning system which combines a plurality of laser beams emitted from a plurality of semiconductor lasers into a single laser beam and scans an object with the combined leaser beam.

2. Description of the Prior Art

There have been used various light beam scanning systems in which a light beam is deflected by a light deflector to scan a recording medium to record thereon various information or to read information recorded thereon. In such light beam scanning systems, it is known to use a semiconductor laser as the means for generating the light beam. The semiconductor laser is advantageous over other light sources such as a gas laser in that it is small in size and inexpensive, and has low power consumption. Further, in the case of the semiconductor laser, the light beam can be directly modulated by changing the driving current.

On the other hand, the semiconductor laser can continuously output 20 to 30 mW at most and accordingly, it has been difficult to use the semiconductor laser in light beam scanning systems in which a high energy light beam is required, e.g., a light beam scanning system for recording on a recording medium having a low sensitivity such as a metal film, an amorphous film or other draw materials.

When certain kinds of phosphors are exposed to a radiation such as X-rays, α-rays, β-rays, γ-rays, cathode rays or ultraviolet rays, they store a part of the energy of the radiation. Then, when the phosphor which has been exposed to the radiation is exposed to stimulating rays such as visible light, light is emitted by the phosphor in proportion to the stored energy of the radiation. A phosphor exhibiting such properties is referred to as a stimulable phosphor, and a sheet provided with a layer of the stimulable phosphor is generally referred to as a stimulable phosphor sheet. As disclosed in Japanese Unexamined patent publication Nos. 55(1980)-12429, 55(1980)-116340, 55(1980)-163472, 56(1981)-11395, 56(1981)-104645 and the like, it has been proposed to use a stimulable phosphor sheet in a radiation image recording and reproducing system. Specifically, the stimulable phosphor sheet is first exposed to a radiation passing through an object to have a radiation image stored thereon, and is then scanned with stimulating rays such as a laser beam which cause it to emit light in the pattern of the stored image. The light emitted by the stimulable phosphor sheet upon stimulation thereof is photoelectrically detected and converted to an electric image signal, which is processed as desired to reproduce a visible image on a recording medium such as a photographic film or on a display device such as a cathode ray tube (CRT). In such systems currently available, the stimulating rays must have a high energy and accordingly, it has been very difficult to use a semiconductor laser as a source of the stimulating rays.

It will be possible to obtain a scanning light beam having a high energy by combining laser beams emitted by a plurality of semiconductor lasers into a single laser beam. (In this case, the laser beams may be combined between the laser sources and the object to be scanned or on the object to be scanned.) When the stimulating rays for stimulating the stimulable phosphor are obtained by combining laser beams, laser beams having the same wavelengths will be used so that the combined laser beam has a wavelength suitable for stimulating the stimulable phosphor. However, there is a problem that a slight difference in wavelength between the laser beams to be combined generates beat in the combined laser beam, whereby the amount of the scanning light can be changed from picture element to picture element to adversely affect the accuracy in recording or reading.

SUMMARY OF THE INVENTION

In view of the foregoing observations and description, the primary object of the present invention is to provide a light beam scanning system in which a plurality of laser beams emitted by semiconductor lasers are combined into a single laser beam and the combined laser beam is caused to scan an object without fluctuation in the amount of scanning light.

In accordance with the present invention, the oscillation wavelengths of the semiconductor lasers are selected so that the oscillation wavelengths $\lambda i$ and $\lambda j$ of any two of the semiconductor lasers satisfy the formula $$|\lambda i - \lambda j| \geq \lambda i \lambda j M/c$$

wherein M and c respectively represent the picture element frequency and the velocity of light The frequency $\Delta \nu$ of the beat generated in a laser beam obtained by combining two laser beams can be represented by $|\nu i - \nu j|$ wherein $\nu i$ and $\nu j$ respectively represent the frequencies of the two laser beams. Since $\nu i = c/\lambda i$ and $\nu j = c/\lambda j$, $$\Delta \lambda = |c/\lambda i - c/\lambda j| = c|\lambda i - \lambda j|/\lambda i \lambda j$$

Accordingly, when the frequency $\Delta \nu$ of the beat is sufficiently higher than the picture element frequency M, that is when $$M \leq \Delta \nu = c|\lambda i - \lambda j|/\lambda i \lambda j$$

$$\therefore |\lambda i - \lambda j| \geq \lambda i \lambda j M/c \quad (1)$$

the beat is uniformly repeated in all the picture elements, whereby the amount of scanning light for each picture element becomes the same.

DESCRIPTION OF THE PREFERRED EMBODIMENTS

Figure 1:
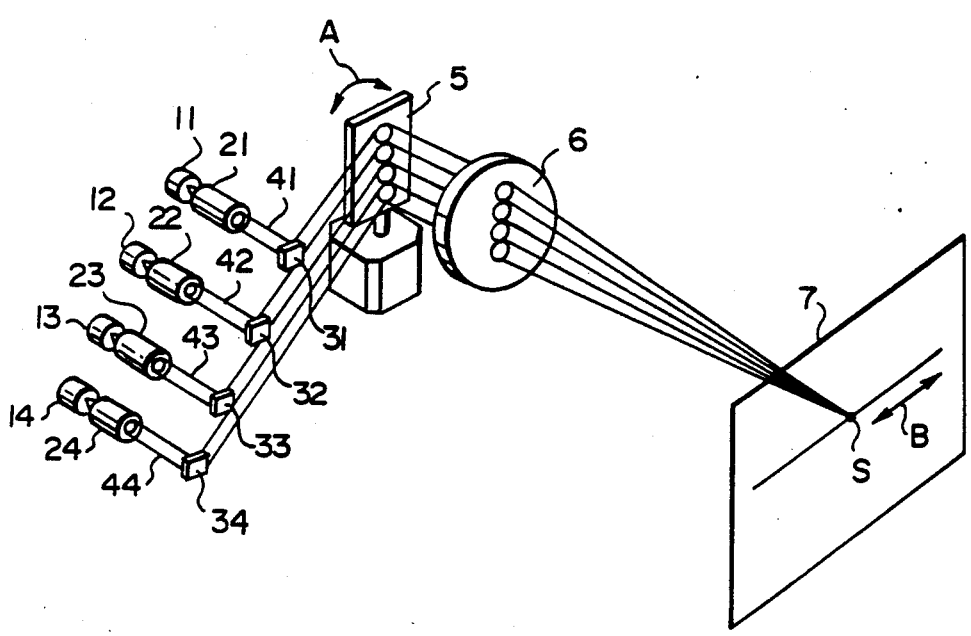
FIG. 1 is a schematic perspective view of a light beam scanning system in accordance with an embodiment of the present invention.

In FIG. 1, a light beam scanning system in accordance with an embodiment of the present invention comprises a plurality (four in this particular embodiment) of semiconductor lasers 11 to 14 disposed so that the beam emanating axes thereof are in parallel to each other. A combination of a collimator lens and a reflecting mirror is provided for each semiconductor laser.

The collimator lenses for the semiconductor lasers 11 to 14 are respectively indicated at 21 to 24, and the reflecting mirrors for the semiconductor lasers 11 to 14 are respectively indicated at 31 to 34. The laser beams emitted from the semiconductor lasers 11 to 14 are collimated into collimated beams 41 to 44 by the corresponding collimator lenses 21 to 24, and the collimated beams 41 to 44 are reflected by the corresponding mirrors 31 to 34 to impinge upon a galvanometer mirror 5.

The galvanometer mirror 5 is rotated back and forth as shown by arrows A in FIG. 1 to deflect the collimated beams 41 to 44 in the direction of arrows B. The collimated beams 41 to 44 are focused on a spot S by a focusing lens 6. That is, the collimated beams 41 to 44 are combined into a single beam on the spot S. Thus, by arranging the system to be positioned on a surface-to-be-scanned 7, the surface-to-be-scanned 7 is scanned with a high energy light beam obtained by combining the four laser beams emitted from the semiconductor lasers 11 to 14. Generally, the surface-to-be-scanned 7 is a flat surface and accordingly an $f\theta$ lens is used as the focusing lens 6 in this particular embodiment.

In this particular embodiment, all the semiconductor lasers 11 to 14 have an oscillating wavelength of 780 nm to scan the surface-to-be-scanned 7 with a monochromatic light beam having a wavelength of 780 nm. However, as is well known, the wavelengths of the laser beams emitted from the four semiconductor lasers 11 to 14 very slightly differ from each other. Thus, in this embodiment, the wavelengths of the laser beams emitted from the semiconductor lasers 11 to 14 are selected so that the wavelengths $\lambda i$ and $\lambda j$ of laser beams emitted from any two of the semiconductor lasers 11 to 14 satisfy said formula (1). That is, assuming that the required picture element frequency is 1 MHz and the combined laser beam is desired to have a beat frequency of about five times the required picture element frequency, the oscillating wavelengths of any two of the semiconductor lasers 11 to 14 should differ from each other by at least $1 \times 10^{-5}$ nm. That is, $$|\lambda i - \lambda j| = 5 \times (780 \times 10^{-9})^2 \times 1 \times 10^6 / 3 \times 10^8$$
$$\approx 1 \times 10^{-5} \text{ nm} \qquad (2)$$

Figure 2:
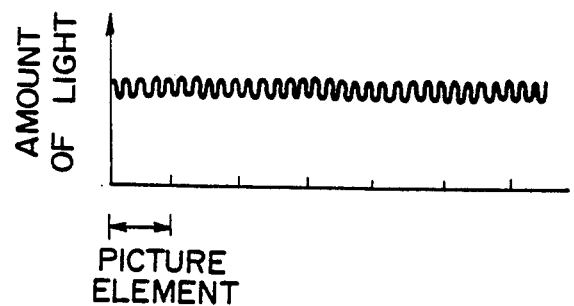
FIGS. 2 and 3 are views for illustrating the effect of the present invention.

When the oscillating wavelengths of the lasers 11 to 14 are selected as described above, the beat frequency of the combined laser beam is about five times the picture element frequency and beat occurs five times in each picture element as can be understood from FIG. 2, whereby the amount of scanning light can be the same for all the picture elements.

Though the value 780 nm ($=\lambda i=\lambda j$) in formula (2) is not strictly precise, the deviation from the real value is negligible and causes little difference to the value of the wavelength difference obtained from formula (2).

Figure 3:
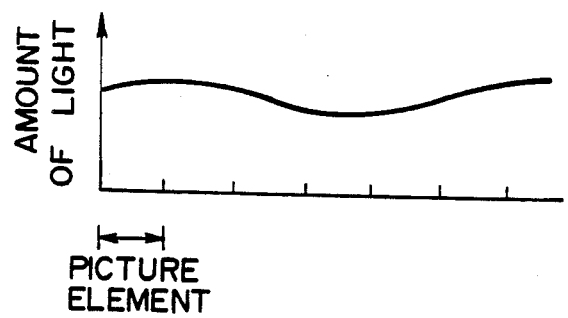

If the beat frequency of the combined laser beam is lower than the picture element frequency as shown in FIG. 3, the amount of scanning light will fluctuate due to the beat of the combined laser beam. Therefore, in order to prevent fluctuation in the amount of scanning light, the beat frequency should be at least equal to the picture element frequency. That is, $|\lambda i - \lambda j| \geq \lambda i \lambda j M/c$.

However, in order to make the amount of scanning light for each picture element more uniform, it is preferred that the oscillating wavelengths of the semiconductor lasers 11 to 14 be selected so that the beat frequency becomes about five times the picture element frequency as in the embodiment described above.

It is said that the longitudinal mode spectral width of a semiconductor laser is of the order of $10^{-5}$ Å under ideal conditions in which the temperature and the electric current are perfectly stabilized. However, this value varies with the driving conditions of the semiconductor laser. For example, when the temperature of the device is stabilized so that fluctuation in the temperature of the device is within $\pm 0.01°$ K., and the output is stabilized by current-feedback, the spectral width becomes of the order of $10^{-4}$Å. When current-feedback is not effected, the spectral width becomes of the order of $10^{-3}$Å. Further, when the device is operated under room temperature without stabilizing the temperature of the device and without current-feedback, the spectral width becomes of the order of $10^{-1}$Å. Further, when the temperature and/or the current fluctuate by a large amount, so-called mode hopping, a longitudinal mode hopping, will occur. Each mode hop generates a wavelength change of about 2 to 3 Å.

Therefore, the oscillating wavelengths of the semiconductor lasers must be selected taking into account the conditions in which the lasers are to be operated so that the oscillating wavelengths $\lambda i$ and $\lambda j$ of any two of the lasers satisfy formula (1) at any instance under the conditions.

Figure 4:
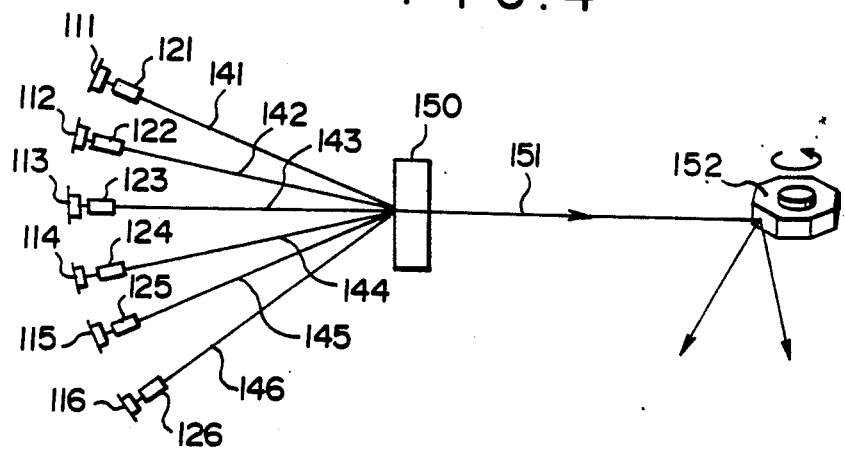
FIG. 4 is a schematic view of a light beam scanning system in accordance with another embodiment of the present invention.

Though in the embodiment described above, the four laser beams 41 to 44 are combined on the surface-to-be-scanned 7, the laser beams may be combined into a single beam prior to deflection as shown in FIG. 4. In the embodiment shown in FIG. 4, laser beams 141 to 146 respectively emitted by six semiconductor lasers 111 to 116 and collimated by collimator lenses 121 to 126 are combined into a single laser beam 151 by a beam combining means 150. Then, the single laser beam 151 is deflected to scan a surface-to-be-scanned (not shown) by a light deflector 152 which is a rotating polygonal mirror in this particular embodiment. The beam combining means 150 may be a known one such as a hologram device or a biaxial crystal device. Also in this embodiment, the oscillating wavelengths of the semiconductor lasers 111 to 116 are selected in the same manner as in the embodiment described above.

As the deflector, a hologram scanner, an acoustooptic deflector (AOD) or the like can be used instead of the galvanometer mirror or the polygonal mirror employed in the embodiments described above.

Though in the embodiments described above, the scanning beam is deflected by a deflector to scan the surface-to-be-scanned, the present invention may be applied to various other scanning systems such as those in which scanning is effected by rotating the surface-to-be-scanned or by moving an optical head.

I claim:

1. A light beam scanning system in which laser beams emitted by a plurality of semiconductor lasers are combined into a single laser beam and the single laser beam is caused to sweep a surface-to-be-scanned, characterized in that the oscillation wavelengths of the semiconductor lasers are selected so that the oscillation wavelengths $\lambda i$ and $\lambda j$ of any two of the semiconductor lasers satisfy the formula $$|\lambda i - \lambda j| \geq \lambda i \lambda j M/c$$

wherein M and c respectively represent the picture element frequency and the velocity of light.

2. A light beam scanning system as defined in claim 1 in which the oscillation wavelengths of the semiconductor lasers are selected so that the oscillation wavelengths $\lambda i$ and $\lambda j$ of any two of the semiconductor lasers satisfy the formula $$|\lambda i - \lambda j| \geq 5(\lambda i \lambda j M/c)$$

wherein M and c respectively represent the picture element frequency and the velocity of light.

* * * * *